(12) United States Patent
Ackermann et al.

(10) Patent No.: US 7,067,007 B2
(45) Date of Patent: Jun. 27, 2006

(54) PROCESS AND DEVICE FOR GROWING SINGLE CRYSTALS

(75) Inventors: Lothar Ackermann, Idar-Oberstein (DE); Daniel Rytz, Herborn (DE); Klaus Dupre, Idar-Oberstein (DE)

(73) Assignee: Schott Glas, Mainz (DE)

( * ) Notice: Subject to any disclaimer, the term of this patent is extended or adjusted under 35 U.S.C. 154(b) by 124 days.

(21) Appl. No.: 10/646,207

(22) Filed: Aug. 22, 2003

(65) Prior Publication Data

US 2004/0099206 A1 May 27, 2004

(30) Foreign Application Priority Data

Aug. 24, 2002 (DE) ............... 102 38 876
Apr. 7, 2003 (DE) ............... 103 15 706

(51) Int. Cl.
*C30B 15/14* (2006.01)

(52) U.S. Cl. ............... 117/13; 117/15; 117/34; 117/208; 117/213; 117/217

(58) Field of Classification Search ............... 117/13, 117/15, 34, 208, 213, 217
See application file for complete search history.

(56) References Cited

U.S. PATENT DOCUMENTS

| | | | | |
|---|---|---|---|---|
| 6,364,947 B1 * | 4/2002 | Iida et al. | | 117/206 |
| 6,409,833 B1 * | 6/2002 | Park | | 117/217 |
| 6,482,263 B1 * | 11/2002 | Ferry et al. | | 117/217 |
| 6,527,859 B1 * | 3/2003 | Lee et al. | | 117/217 |
| 6,554,898 B1 * | 4/2003 | Lu et al. | | 117/217 |

FOREIGN PATENT DOCUMENTS

EP 417948 * 3/1991

* cited by examiner

*Primary Examiner*—Robert Kunemund
(74) *Attorney, Agent, or Firm*—Michael L. Dunn

(57) ABSTRACT

The process for growing single crystals, wherein crystal material is melted in a crucible and a crystal nucleus is immersed in the molten crystal material and slowly pulled out, wherein the crystal formed during the pulling is kept at a temperature close to melting temperature of the output material. The invention also includes a device for practicing the above process.

26 Claims, 1 Drawing Sheet

PROCESS AND DEVICE FOR GROWING SINGLE CRYSTALS

BACKGROUND OF THE INVENTION

The present invention relates to a device for growing single crystals, in which crystal material is melted in a crucible, a crystal nucleus or seed crystal is immersed in the molten crystal material and slowly pulled out of the melt, so that further material continuously crystallizes on the crystal nucleus and forms the single crystal. The present invention further relates to a device for carrying out the crystal-growing process.

The mineral corundum $Al_2O_3$ has a trigonal-skalenoid symmetry and generally forms crystals of prismatic, pyramidal, tabular, or rhomboid habitus. An example of a corundum crystal is the sapphire. Sapphires are gems occurring in nature, made from aluminum oxide $Al_2O_3$ with a corundum structure. Sapphires generally have an iron content which lies between 0.005 and 0.8% Fe and contain small quantities of titanium in oxidation stage +4. In industry, synthetically produced colorless corundum single crystals are also referred to as sapphires.

Recently, 0° sapphire wafers have been used as carrier substrates for the growth of GaN, InGaN and similar semiconductor layers for the production of LEDs, in particular of blue-white LEDs. Here 0° means that the crystallographic c-axis is oriented perpendicular to the wafer surface. 0° sapphire wafers are particularly suitable for epitaxy, as they possess a suitable lattice constant and suitable surface properties, so that epitaxial growth of the desired semiconductor layers can take place easily.

In particular in the production of LEDs it is an advantage if the crystal material, i.e. in particular the sapphire wafer used as a base, has a few crystal structure defects as possible, as the yield of good LEDs per wafer can thereby be increased, which in turn contributes to a reduction in costs.

However, sapphire possesses anisotropic physical properties. For example, the linear thermal expansion coefficient behaves differently in the two main crystallographic directions. If a sapphire crystal is heated for example from 20° C. to 980° C., the lattice constant changes in the a-direction by approximately 0.8%, whilst the lattice constant in the c-direction changes by approximately 0.9%. With the known crystal growing processes, this can lead to problems which reduce the quality of the synthetically produced sapphires.

For the production of sapphire crystals—mainly for the watch glass industry—hitherto the Verneuil process has chiefly been used. In this process, aluminum oxide powder is trickled through an oxyhydrogen flame and melted to form drops, which settle on a sapphire seed arranged beneath, and grow there. With this process, sapphire crystals with a diameter of up to approximately 40 mm are grown, which however generally have small-angle grain boundaries and other crystal structure defects.

At present, sapphire crystals for GaN epitaxy are essentially grown according to the following four different processes:

Czochralski process: In this process, a seed crystal is immersed in melt present in a crucible and then pulled out again, in self-supporting manner, whilst precisely controlling the rate of pulling. As the melt has a temperature above, and the seed crystal a temperature below the melting temperature of the crystal, at a suitably selected rate of pulling, crystal material crystallizes on the seed crystal. In this process however a relatively high thermal gradient is formed over the crystal already pulled out of the melt. This can give rise to lattice structure defects in the crystal—caused by the anisotropic linear thermal expansion coefficients.

In the known devices for carrying out the Czochralski crystal pulling process, the crystal material is generally melted in a crucible serving as a susceptor, by means of an induction coil serving as an inductor, with the crucible susceptor being heated by the inductor, so that, in turn, the material present in the crucible is heated. As no other heating elements are provided, a very high temperature gradient inevitably forms along the crystal grown.

A large number of tests have shown that the poor quality, in particular the large number of crystal structure defects in the crystals produced with the standard Czochralski process, is essentially due to the relatively high thermal gradients, in particular in the pulling direction, i.e. in the axial direction of the crystal oriented in the c-direction.

In order to minimize this effect in the crystal during this growing process, the seed crystal is oriented so that the crystallographic c-axis is at an angle of 60° or 90° to the pulling direction. Although, with this process, relatively high-grade crystals are produced, the crystal yield for wafers oriented along the c-axis is however very small, as ingots, i.e. blocks of crystal have to be drilled sideways out of the crystals produced in this way, for wafer production. This process is therefore very time-consuming and expensive.

Nacken-Kyropoulos process: In this process, 90° sapphire crystals, i.e. crystals, in which the pulling direction runs perpendicular to the c-axis of the crystal, are grown with relatively large diameters. In order to obtain 0° wafer ingots, corresponding cylinders then have to be drilled out of the crystals produced, perpendicular to the pulling direction in the direction of the crystallographic c-axis, and then sawn up in order to obtain wafers. This growing process is extremely labor-intensive and has only a small material yield.

Bagdasarov process: The sapphire single crystals grown by means of this process have a bar-shaped expansion, with the 0° direction, i.e. the crystallographic c-axis, usually lying in the direction of the smallest dimension, which is itself generally smaller than 30 mm, with an optimum process development. Although corresponding 0° wafer ingots can also be drilled out in this case, these are however so short, that efficient further processing to produce wafers is scarcely economic.

Heat-exchanger method: In the heat-exchanger method, which is also referred to as HEM, the raw material, melted in a crucible, is solidified from the crucible floor upwards by suitable cooling. By placing seed crystals on the crucible floor, the crystal orientation can be predetermined. With this growing method, although quite large and qualitatively high-grade crystals can be produced, the time required is very considerable.

BRIEF DESCRIPTION OF THE INVENTION

It is therefore an object of the present invention to make available a process and a device with which it is possible to cost-effectively produce sapphire crystals with high crystal quality, oriented in the direction of the c-axis (0° direction). 0° wafers can be produced from such crystals via cylindrical grinding and sawing up without large material loss.

The object with respect to the process is achieved in that, in the pulling process previously described, during the slow pulling out of the crystal nucleus, a low temperature gradient is set between molten crystal material and the single crystal pulled out of the melt.

More particularly the invention includes a process for growing single crystals wherein crystal material is melted in a crucible and a crystal nucleus is immersed in the molten crystal material and slowly pulled out, wherein the crystal formed during the pulling is kept at a temperature close to melting temperature of the output material.

The formed crystal is preferably kept at a temperature close to the melting temperature by at least partly offsetting heat loses by additional heating. More particularly, the process for growing single crystals is a process wherein crystal material is melted in a crucible and a crystal nucleus is immersed in the molten crystal material and slowly pulled out, wherein the crystal formed during the pulling is kept at a temperature close to and above a melting temperature of the output material by induction heating of an electrically conductive susceptor including at least one electrically conductive tube surrounding and heating the crucible, at least while the crystal is slowly pulled out, and surrounding and maintaining a temperature gradient in the pulled crystal within 4 degrees K per cm. The invention further includes a device for growing single crystals having a crucible to receive molten crystal material, a heating device for heating the crucible and the crystal material and a device for pulling the crystal out of the melt using an immersed crystal nucleus wherein a heating element is provided surrounding the crystal during the pulling, which prevents rapid cooling of the solidified crystal material in comparison with the melt and a large temperature gradient within solidified crystal material. The heating device and heating element include an electrically conductive susceptor having at least one electrically conductive tube surrounding and heating the the crucible and an inductor is provided for inductively heating the susceptor.

DETAILED DESCRIPTION OF THE INVENTION

Figure 1:
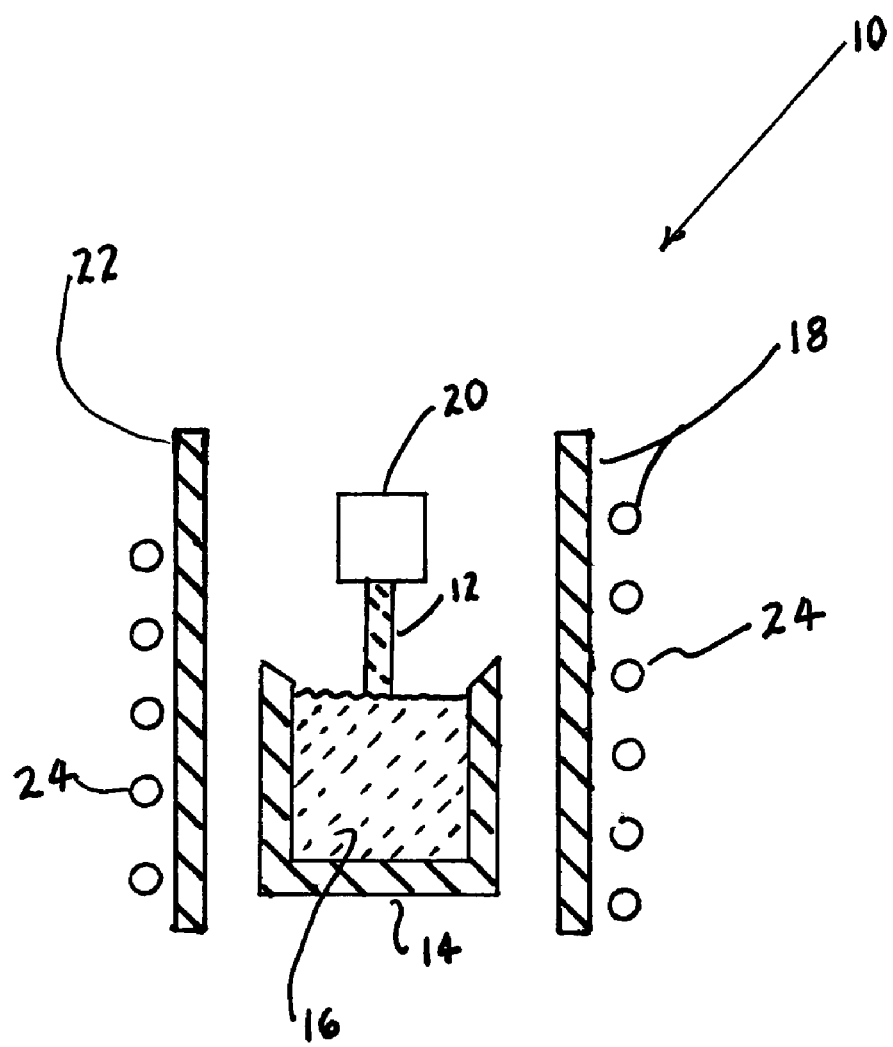
FIG. 1 shows a cross sectional view of a device in accordance with the invention suitable for practicing the process of the invention.

The present invention is based on corundum single crystal growing trials and is therefore described with reference to the growing of these crystals by way of example. However it is understood that the invention is not limited to the growing of corundum crystals.

The reduction of the temperature gradient according to the invention can for example be carried out by separate heating of the furnace space in which the crucible is situated, by means of the additional heating.

According to the invention, care is taken that the temperature gradient is kept as small as possible over the crystal pulled out of the crucible It should be noted that a small temperature gradient is an advantage i.e., the melt advantageously has a temperature above the melting point of the crystal material, whilst the crystal being pulled must always have a temperature below the melting point.

In a further particularly preferred version, provision is made for shielding and/or additional heating to be arranged in such a way that an essentially constant temperature gradient is set in the pulling direction of the crystal. A particularly homogeneous and possibly defect-free crystal can thus be produced.

The temperature gradient in the solidified crystal material is advantageously kept, during the pulling, below a maximum value of 4° K/cm, preferably below a maximum value of 3° K/cm.

Moreover, in one preferred version, provision is made, after the pulling of the crystal, for the maximum temperature gradient within the crystal to be set to a value below 2° K and for the whole crystal to be cooled down evenly, thus largely avoiding crystal defects.

As seen in FIG. 1, in one advantageous version of the process according to the invention the small temperature gradient is achieved in that the crucible 14, at least during the slow pulling-out stage, is arranged in a preferably vertically arranged tube 22 made from electrically conductive material, which serves as a susceptor, and the tube 22 in inductively heated with an inductor 24.

In principle the tube can have any cross-section, however it is preferable to use a round cross-section, in order to achieve the most homogeneous temperature distribution possible inside the tube. Due to the tubular arrangement, it is in particular achieved, that in an axial direction, i.e. in the pulling direction, the temperature gradient can be distinctly reduced in comparison with the known Czochralski process.

In a further particularly advantageous version, at least the slow pulling-out of the crystal nucleus takes place under vacuum, preferably under a pressure of between $10^{-2}$ and $10^{-8}$ hPa.

Alternatively, in another advantageous version, provision is made for at least the slow pulling out of the crystal nucleus to take place in an atmosphere which consists of argon or nitrogen or a mixture of argon and oxygen, the oxygen proportion preferably being between 0 and 2 vol.-%, or a mixture of nitrogen and oxygen, the oxygen proportion preferably being between 0 and 2 vol.-%, or a mixture of argon and hydrogen, the hydrogen proportion preferably being between 0 and 10 vol.-%. Mixtures of argon and nitrogen may also be used at essentially any ratio.

By the corresponding selection of the growing atmosphere the quality of the crystal to be grown can be increased. In addition, owing to the different heat capacities and conductivities of the growing atmospheres used, the temperature gradient is correspondingly influenced.

The temperature in the environment of the crucible can be advantageously adjusted. This can be expediently be done by suitable selection of the inductor dimension and/or susceptor geometry. By this measure the temperature gradient is also inevitably adjusted. Temperature may also be adjusted by adjusting the amperage, voltage and frequency through the inductor thus affecting the electromagnetic flux through the susceptor.

In a particularly preferred version of the process according to the invention, the susceptor material, i.e. the material from which the tube is made, is selected depending on the material of the crucible and the growing atmosphere used. Depending on the crystal to be grown—owing to the different melting temperatures—a different crucible material may be particularly suitable. By the selection of the crucible material, the power to be supplied by the inductor in order to melt the crystal material is simultaneously determined. As the susceptor tube is generally heated by the same inductor the heating energy supplied by the susceptor tube can be adjusted by selecting the susceptor material.

The process is particularly advantageous, as already mentioned at the start, in the growing of corundum crystals, in particular of sapphire crystals, with a corundum crystal ($Al_2O_3$) or sapphire crystal serving as crystal nucleus or seed crystal.

The crystal nucleus is advantageously immersed in the crystal material and slowly pulled out in the direction of the crystallographic c-axis. This ensures that the single crystal formed is particularly suitable for the production of 0° wafers. Owing to the low temperature gradient according to the invention, it is possible for the first time, using the process according to the invention, to easily produce sapphire crystals oriented along the c-axis and largely free of structure defects, which are highly suitable for epitaxy.

As seen in FIG. 1, with respect to the device, the object described at the start is acheived by a device 10 for growing single crystals 12 with a crucible 14 to receive molten crystal material 16, a heating device 18 for heating the crucible 14 and/or crystal material 16 and a device 20 for pulling crystals 12 out of the melt, for example using an immersed crystal nucleus, characterized in that a shield and/or heating element 18 surrounding the crystal during the pulling is provided, which prevents rapid cooling of the solidified crystal material compared with the melt 16 and/or a large temperature gradient within the solidified crystal material 12.

The heating device 18 advantageously consists of a tube 22 made from electrically conductive material (susceptor) preferably arranged vertically, inside which the crucible 14 is arranged, and an inductor 24, which heats the tube 22 inductively. The inductive construction has the advantage that no electrical connections have to be introduced into the furnace. It is understood that even if the construction of the susceptor as a single-piece tube is particularly preferable, the susceptor can of course also be made up of two or more pieces standing on one another, or in another manner.

A further advantage in comparison with a resistance-heated furnace is the distinctly lower maintenance cost. With resistance-heated furnaces in the 2000° C. range, the expensive heating elements have to be dismantled and renewed after a few growing processes. The relatively cost-effective susceptor tubes can be simply exchanged.

By the direct coupling of the induction line to the crucible in the standard Czochralski pulling process, tensions are also produced in the crucible, which considerably influence the crucible's service life. The heating of the crucible via the surrounding tube is considerably gentler for the crucible and increases service life.

In addition it is easy to retrofit existing crystal growing plants with a susceptor tube. The existing inductor or an extended inductor can then be used as an inductor for heating the crucible.

It has been shown, that in a particularly preferred version, the tube/susceptor consists of graphite, tungsten, molybdenum, iridium, rhenium, tantalum, osmium, or an alloy of the above-mentioned elements. Molybdenum-tungsten and tungsten-rhenium are preferably considered as alloys in this case.

In a further particularly preferred version, the susceptor length is adjustable. This adjustability can for example be achieved in that at least two different susceptors with different lengths are made available, which are optionally introduced into the furnace. Alternatively, the susceptor can also be movable, so that it can be at least partially withdrawn from the induction field formed by the inductor.

In a particularly advantageous version, the device for pulling the crystal serves as a heating device. This can either be achieved in that the pulling device is formed as a susceptor, or by providing a susceptor element on the pulling device. With this version in particular, it is particularly simple to keep the upper end of the crystal, i.e. the end away from the melt, at a constant temperature below the melting point. Of course this can however also be advantageously achieved with the other versions described.

It has proved to be particularly advantageous, if the crucible consists of iridium, molybdenum, tungsten, rhenium, tantalum, osmium, or alloys of the above-mentioned elements, such as e.g. molybdenum-tungsten, tungsten-rhenium.

In order to be able to set the temperature gradients as well as possible, in an advantageous version, it is provided that the susceptor tube has a varying wall thickness and is preferably arranged so that it is movable. It is then easy to set the temperature gradient by axial displacement of the susceptor tube.

Further advantages, features and possible uses of the present invention are made clear by the following description of a particularly preferred version.

In a particularly preferred version of the process according to the invention, aluminum oxide powder is placed in a crucible made from iridium. The crucible is now placed in the furnace and a susceptor tube made from graphite, tungsten, rhenium or another suitable high temperature electroconductive material is placed over the crucible, so that the susceptor tube surrounds the crucible and the holding device for the seed crystal. By means of an inductor, the susceptor tube and thereby also the crucible are now heated, until the crystal raw material has melted.

Now a sapphire seed crystal, whose c-axis is oriented in the pulling direction is first immersed in the melt and then slowly pulled out of the latter again, so that a sapphire single crystal oriented in the pulling direction crystallizes on the seed crystal. Owing to the fact that the susceptor tube is also heated by the inductor, i.e. it essentially functions as a resistance heater, the temperature gradient along the single crystal being pulled, from the melt to the seed crystal, amounts to less than 2° K/cm. By the provision of such a small temperature gradient, in particular in the axial direction, i.e. in the pulling direction of the crystal, the quality of the single crystal grown can be distinctly improved. The temperature gradient can be set by corresponding choice of the size and the material of the susceptor tube.

Although the process according to the invention and the device according to the invention have been described only with reference to the growing of a sapphire single crystal, it is understood that the invention can also be used for growing other crystals, in particular for growing single crystals with strongly anisotropic physical properties.

This process is in particular advantageous if, during the growing, a horizontal growth front is to be set.

What is claimed is:

1. The process for growing single crystals, wherein crystal material is melted in a crucible and a crystal nucleus is immersed in the molten crystal material and slowly pulled out, wherein the crystal formed during the pulling is kept at a temperature close to melting temperature of the output material, wherein a corundum crystal nucleus ($Al_2O_3$) is used.

2. The process according to claim 1 by induction heating of an electrically conductive susceptor comprising at least one electrically conductive tube surrounding and heating the crucible, wherein the crystal formed during the pulling is kept at a temperature close to and above a melting temperature of the output material at least while the crystal is slowly pulled out, and maintaining a temperature gradient in the pulled crystal within 4 degrees K per cm.

3. The process according to claim 1, wherein the crystal nucleus is immersed in the crystal material and slowly pulled out in approximately the direction of the crystallographic c-axis with a deviation of less than +15°.

4. The process according to claim 1, wherein during the slow pulling-out of the crystal nucleus, a low temperature gradient is set between molten crystal material and the single crystal pulled out of the melt.

5. The process according to claim 1, wherein shielding and additional heating by the susceptor are arranged in such a way that an essentially constant temperature gradient is set in the pulling direction of the crystal.

6. The process according to claim 1, wherein after the pulling of the crystal, the maximum temperature gradient inside the crystal is set to a value below 4° K/cm and the whole crystal is cooled down evenly.

7. The process according to claim 1, wherein at least the slow pulling-out takes place under vacuum.

8. The process according to claim 7, wherein at least the slow pulling-out takes place under vacuum under a pressure of between $10^{-2}$ and $10^{-8}$ hectopascals.

9. The process according to claim 1, wherein at least the slow pulling-out takes place in a growing atmosphere selected from the group consisting of argon; nitrogen; a mixture of argon and oxygen, the oxygen proportion preferably being between 0 and 2 vol.-%; a mixture of nitrogen and oxygen, the oxygen proportion preferably being between 0 and 2 vol.-%; and a mixture of argon and hydrogen, the hydrogen proportion preferably being between 0 and 10 vol.-%.

10. The process according to claim 1, wherein the temperature in the environment of the crucible is controlled.

11. The process according to claim 10, wherein the temperature in the environment of the crucible is controlled by suitable choice of the inductor dimension and the susceptor geometry.

12. The process according to claim 1, wherein the temperature gradient along the single crystal grown is controlled or regulated between molten crystal material and the crystal nucleus.

13. The process according to claim 12, wherein the setting of the temperature gradient takes place by means of the inductor dimension and the susceptor geometry.

14. The process according to claim 13, wherein susceptor material is selected depending on crucible material and growing atmosphere.

15. The process according to claim 1, wherein a non-metal crystal nucleus is used.

16. The process for growing single crystals, wherein crystal material is melted in a crucible and a crystal nucleus is immersed in the molten crystal material and slowly pulled out, by induction heating of an electrically conductive susceptor comprising at least one electrically conductive tube surrounding and heating the crucible, wherein the crystal formed during the pulling is kept at a temperature close to and above a melting temperature of the output material at least while the crystal is slowly pulled out, and maintaining a temperature gradient in the pulled crystal within 4 degrees K per cm.

17. A device for growing single crystals having a crucible to receive molten crystal material, a heating device for heating the crucible and the crystal material and a device for pulling the crystal out of the melt using an immersed crystal nucleus wherein at least one of a shield and heating element is provided surrounding the crystal during the pulling which prevents rapid cooling of the solidified crystal material in comparison with the melt and a large temperature gradient within solidified crystal material wherein the heating device comprises an electrically conductive susceptor comprising at least one electrically conductive tube surrounding and heating the crucible and an inductor is provided for inductively heating the susceptor.

18. A device according to claim 17, wherein the heating device consists of a susceptor tube made from electrically conductive material inside of which the crucible is arranged, and an inductor which heats the tube inductively.

19. A device according to claim 18, wherein the tube consists of graphite, tungsten, molybdenum, iridium, rhenium, tantalum, osmium, or an allow of the above-mentioned elements.

20. A device according to claim 18, wherein susceptor length is adjustable.

21. A device according to claim 18, wherein the position of the inductor is adjustable.

22. A device according to claim 17, wherein the crucible consists of iridium, molybdenum, tungsten, rhenium, tantalum, osmium, or an alloy of the above-mentioned elements.

23. A device according to claim 18, wherein the crucible consists of iridium, molybdenum, tungsten, rhenium, tantalum, osmium, or an alloy of the above-mentioned elements.

24. The device according to claim 17 where the susceptor is designed to surround the crystal and maintain a temperature gradient of less than 4° K/cm in crystal material slowly pulled out of the melt.

25. The process according to claim 1 where the susceptor is designed to surround the crystal and maintain a temperature gradient of less than 4° K/cm in crystal material slowly pulled out of the melt.

26. The process according to claim 1, wherein the crystal nucleus is immersed in the crystal material and slowly pulled out in approximately the direction of the crystallographic c-axis with a deviation of less than +15°.

* * * * *